US 9,232,666 B2

United States Patent
Ritter et al.

(10) Patent No.: US 9,232,666 B2
(45) Date of Patent: Jan. 5, 2016

(54) CABLE BACKPLANE SYSTEM HAVING STIFFENERS

(71) Applicant: Tyco Electronics Corporation, Berwyn, PA (US)

(72) Inventors: Christopher David Ritter, Hummelstown, PA (US); Robert Paul Nichols, Vacaville, CA (US); Brian Patrick Costello, Scotts Valley, CA (US); Joshua Tyler Sechrist, Etters, PA (US); Nathan Glenn Lehman, Harrisburg, PA (US)

(73) Assignee: Tyco Electronics Corporation, Berwyn, PA (US)

(*) Notice: Subject to any disclaimer, the term of this patent is extended or adjusted under 35 U.S.C. 154(b) by 144 days.

(21) Appl. No.: 14/075,838

(22) Filed: Nov. 8, 2013

(65) Prior Publication Data

US 2015/0129287 A1 May 14, 2015

(51) Int. Cl.
*H05K 5/00* (2006.01)
*H04Q 1/02* (2006.01)

(52) U.S. Cl.
CPC .............. *H05K 5/0069* (2013.01); *H04Q 1/02* (2013.01)

(58) Field of Classification Search
CPC ................................ H05K 5/00; H05K 5/0069
USPC .................................... 174/255; 361/796
See application file for complete search history.

(56) References Cited

U.S. PATENT DOCUMENTS

| 4,398,779 A * | 8/1983 | Ling ................................ 439/64 |
| 5,023,754 A * | 6/1991 | Aug et al. ..................... 361/800 |
| 7,095,622 B2 * | 8/2006 | Barsun et al. ................. 361/788 |
| 2010/0271793 A1* | 10/2010 | Doblar et al. ................. 361/788 |

* cited by examiner

*Primary Examiner* — Timothy Thompson
*Assistant Examiner* — Charles Pizzuto (57) ABSTRACT

A cable backplane system includes a backplane having board areas surrounding a connector opening with holes in the board areas along the connector opening. Stiffeners are coupled to corresponding board areas along a front of the backplane. The stiffeners have bores aligned with corresponding holes in the backplane. A cable rack is coupled to the rear of the backplane. The cable rack has a tray with a frame surrounding a raceway and spacers coupled to the tray that hold corresponding cable connectors. The spacers have guide pins extending therefrom that pass through the holes in the backplane into corresponding bores in the stiffeners to position the spacers relative to the stiffeners and the backplane. The cable connectors are received in the connector opening in the backplane and held in position relative to the backplane by the spacers and stiffeners.

20 Claims, 11 Drawing Sheets

CABLE BACKPLANE SYSTEM HAVING STIFFENERS

BACKGROUND OF THE INVENTION

The subject matter herein relates generally to a cable backplane system for interconnecting electrical components in a communication system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. The cable assemblies need to be held in predetermined locations for mating with line and switch cards. Packaging of such cable assemblies is difficult, particularly positioning in a condensed structure. Some systems use a backplane board to support and position the cable assemblies, however the backplane boards may be unable to withstand the forces exerted during assembly and mating of the line and switch cards.

A need remains for a cable backplane system that is capable of withstanding high insertion forces of cable connectors and line and switch cards.

BRIEF DESCRIPTION OF THE INVENTION

In one embodiment, a cable backplane system is provided that includes a backplane having board areas surrounding a connector opening extending between a front and a rear of the backplane. The backplane has holes in the board areas along the connector opening. Stiffeners are coupled to corresponding board areas along the front of the backplane. The stiffeners extend along the connector opening and have bores aligned with corresponding holes in the backplane. A cable rack is coupled to the rear of the backplane. The cable rack has a tray with a frame surrounding a raceway and spacers coupled to the tray that hold corresponding cable connectors. The spacers have guide pins extending therefrom that pass through the holes in the backplane into corresponding bores in the stiffeners to position the spacers relative to the stiffeners and the backplane. The cable connectors are received in the connector opening in the backplane and held in position relative to the backplane by the spacers and stiffeners.

Optionally, a plurality of the spacers may be coupled to each stiffener. The guide pins may extend thorough the bores and beyond a front of the corresponding stiffener to mate with a daughtercard mated to the cable backplane system. The stiffeners may be fixed to the backplane and the spacers may be fixed to the stiffeners to locate the cable connectors within the connector opening. Optionally, the cable backplane system may include fasteners extending through corresponding bores and holes to threadably couple to the spacer to secure the spacer to the stiffener.

Optionally, the stiffener comprises an elongated body having flanges at opposite ends thereof. The flanges may be secured to the backplane by fasteners. The flanges may be secured to a chassis by the fasteners. Optionally, each stiffener may have an elongated body having a front and a rear. The rear may be mounted to the front of the backplane. The bores may be open at the rear and have a lead-in at the rear to direct the guide pins into the bore.

Optionally, the cable connectors are configured to be mated to corresponding card connectors of a daughtercard mated to the cable backplane system. The cable connectors may be held by the spacers. The cable connectors may float relative to the spacers within the connector opening for mating with the corresponding card connectors. The cable rack may include side walls extending between corresponding spacers. A plurality of cable connectors may extend between corresponding side walls. The cable connectors may float relative to the side walls within the connectors opening.

In a further embodiment, a cable backplane system is provided including a backplane having board areas surrounding a connector opening extending between a front and a rear of the backplane. The backplane has holes in the board areas along the connector opening. Stiffeners are coupled to corresponding board areas along the front of the backplane. The stiffeners extend along the connector opening and have bores extending therethrough. The bores are aligned with corresponding holes in the backplane. A cable rack is coupled to the rear of the backplane. The cable rack includes a tray having a frame surrounding a raceway and spacers coupled to the tray. The spacers hold corresponding cable connectors configured to be mated with corresponding card connectors of a daughtercard. The spacers have guide pins extending therefrom. The guide pins pass through corresponding holes in the backplane and pass through corresponding bores in the stiffeners to position the spacers relative to the stiffeners and the backplane. The guide pins extend beyond the stiffeners to engage guide modules of the daughtercard to locate the daughtercard relative to the stiffener and backplane.

In a further embodiment, a cable backplane system is provided including a chassis having frame members and a backplane having board areas surrounding a connector opening extending between a front and a rear of the backplane. Stiffeners are coupled to corresponding board areas along the front of the backplane. The stiffeners extend along the connector opening. The stiffeners are secured to corresponding frame members of the chassis. A cable rack is coupled to the rear of the backplane. The cable rack includes a tray having a frame surrounding a raceway. Spacers are coupled to the tray and are secured to corresponding stiffeners using fasteners passing through the backplane to position the spacers relative to the backplane. Cable connectors are held by corresponding spacers with cables extending from the cable connectors. The cables are routed in the raceway. The cable connectors are received in connector opening and held in position relative to the backplane by the spacers.

DETAILED DESCRIPTION OF THE INVENTION

Figure 1:
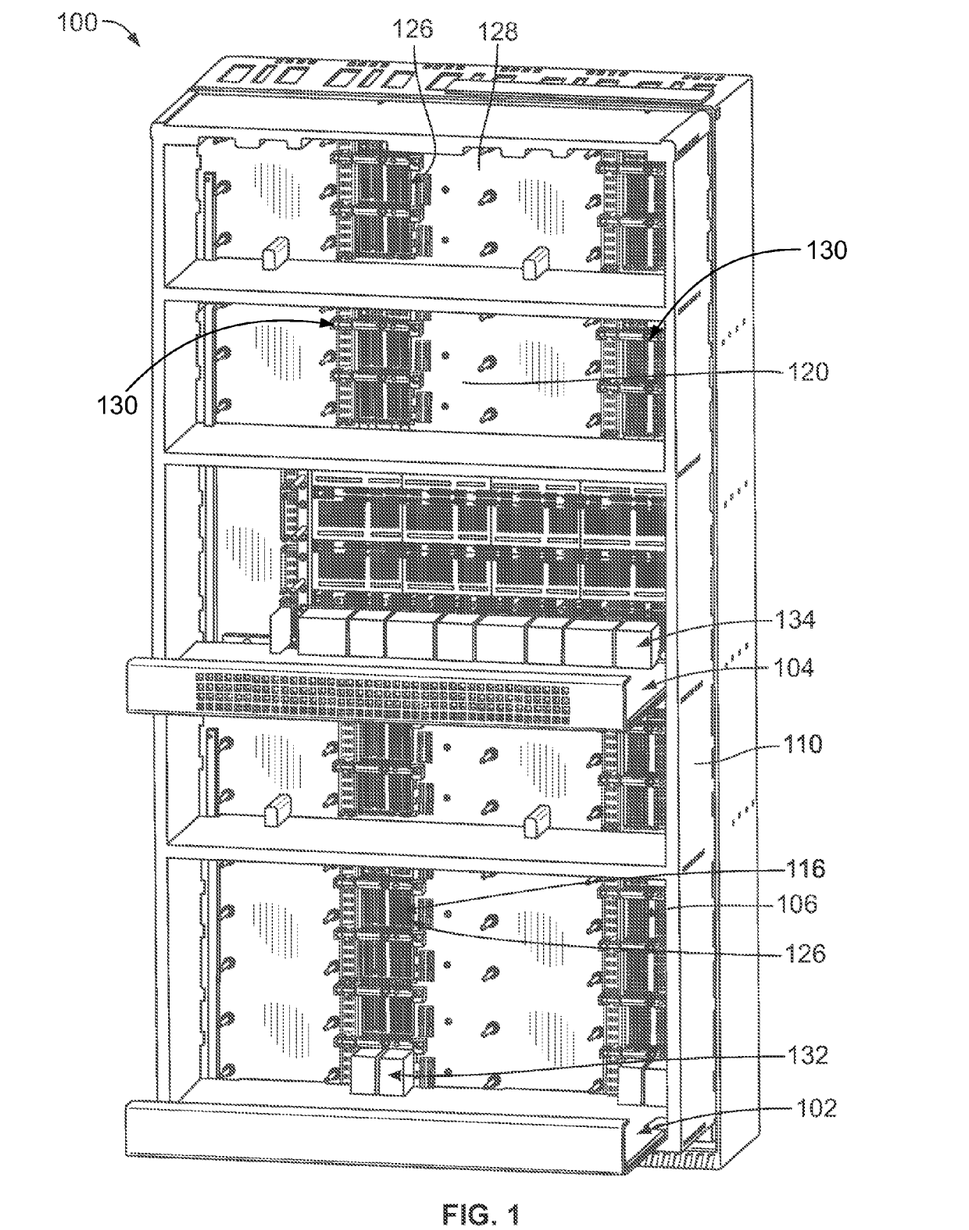
FIG. 1 is a front perspective view of a cable backplane system formed in accordance with an exemplary embodiment.
Figure 2:
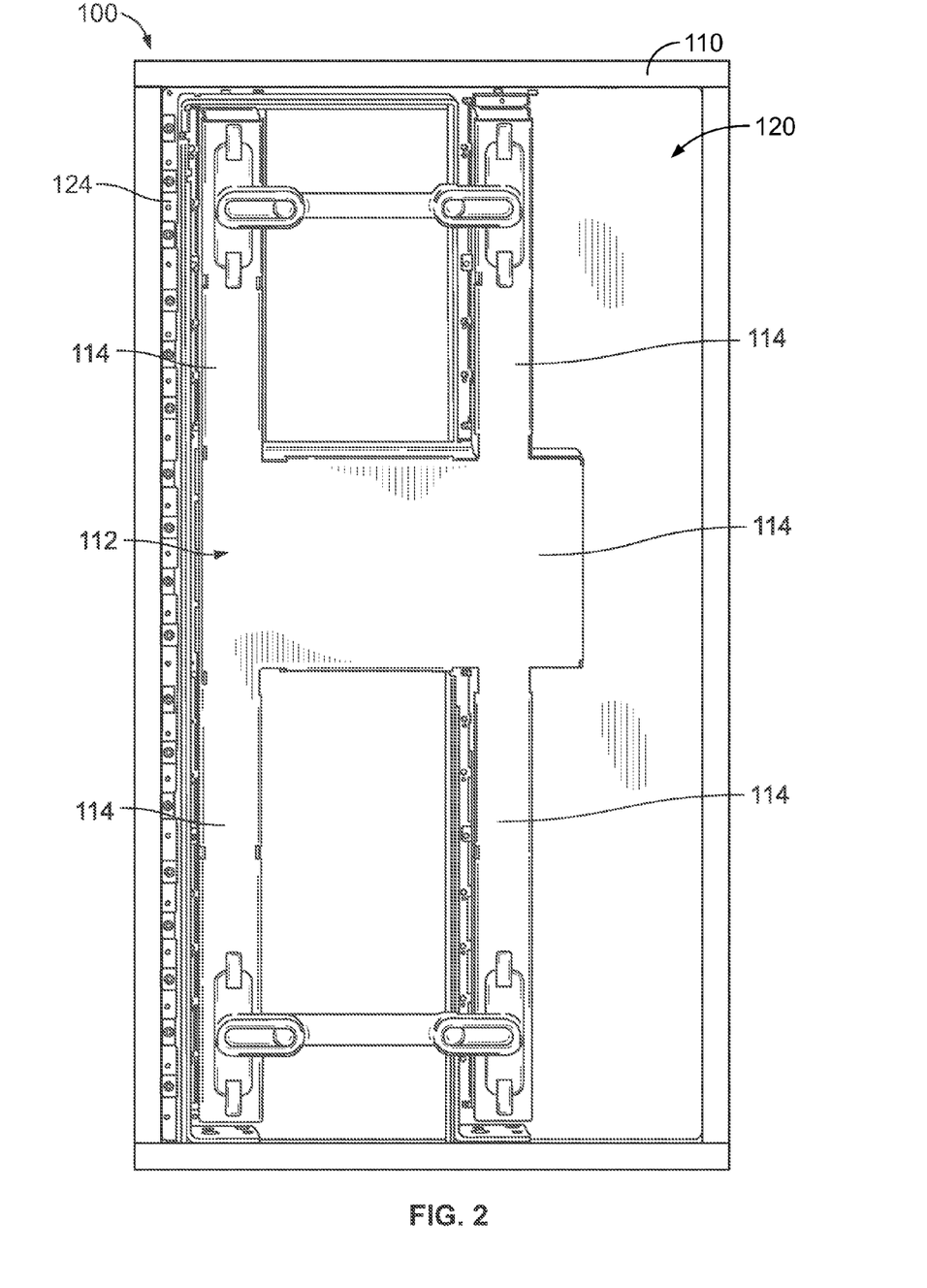
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects with daughter-cards, such as line cards 102 and switch cards 104 using cable connector assemblies 106. The cable backplane system 100 may be used to interconnect with other types of connectors and/or cards in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 (shown in FIG. 2) that supports and/or manages the cables of the cable connector assemblies 106. The cable rack 112 includes a plurality of trays 114 that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 may be a circuit board and may be manufactured from typical circuit board material, such as FR-4 material. Electrical components, such as power supplies, fans, fixed connectors, and the like may be mechanically and/or electrically connected to the backplane 120. Such electrical components may be electrically connected to traces of the backplane 120. The backplane 120 may be manufactured from other materials in alternative embodiments, such as another dielectric or circuit board material or a metal material, such as a metal sheet, such as when no electrical routing on the backplane 120 is required. The cable connectors 116 are not electrically connected to the backplane 120, as is typical of conventional backplanes, but rather the cable connectors 116 are interconnected by cables extending between the cable connectors 116.

The backplane 120 and cable rack 112, with the cable connector assemblies 106, are coupled together to form the cable backplane system 100. The cable rack 112 is provided along a rear 124 of the backplane 120. The cable connectors 116 extend through connector openings 126 in the backplane 120 and are presented at a front 128 of the backplane 120 for mating with the line and switch cards 102, 104.

In an exemplary embodiment, multiple stiffeners 130 (shown in FIG. 1) are provided along the front 128 of the backplane 120. The stiffeners 130 stiffen the backplane 120 along the board areas surrounding a corresponding connector opening(s) 126 to withstand forces exerted on the backplane 120, such as pressure against the backplane 120 during assembly of the cable rack 112 to the backplane 120, mating forces when the line and switch cards 102, 104 are mated to the cable connectors 116, or other forces. The stiffeners 130 provide a structure to which the cable rack 112 may be coupled.

In an exemplary embodiment, the cable rack 112 is flexible to allow the cable connectors 116 to align with and pass through the connector openings 126. For example the trays 114 may be shifted or moved into position with respect to the backplane 120. Optionally, portions of the trays 114 may pass through the connector openings 126 with the cable connectors 116. The trays 114 may float relative to each other to properly align the cable connectors 116 with the corresponding connector openings 126. The backplane 120 and stiffeners 130 hold the cable connectors 116 in precise locations for mating with the line and/or switch cards 102, 104. The backplane 120 and stiffeners 130 have tight tolerances to control mating with the line and switch cards 102, 104. In an exemplary embodiment, the cable connectors 116 float relative to one another and relative to the trays 114 to allow precise positioning of the cable connectors 116 between the stiffeners 130 for mating with the line and/or switch cards 102, 104.

The line and switch cards 102, 104 have card connectors 132, 134, respectively, that mate with corresponding cable connectors 116. The cable connectors 116 need to be precisely positioned relative to the backplane 120 for mating with corresponding card connectors 132, 134. The stiffeners 130 position the cable connectors 116 for mating with the card connectors 132, 134. In an exemplary embodiment, the stiffeners 130 guide the card connectors 132, 134 into proper position for mating with the cable connectors 116.

Figure 3:
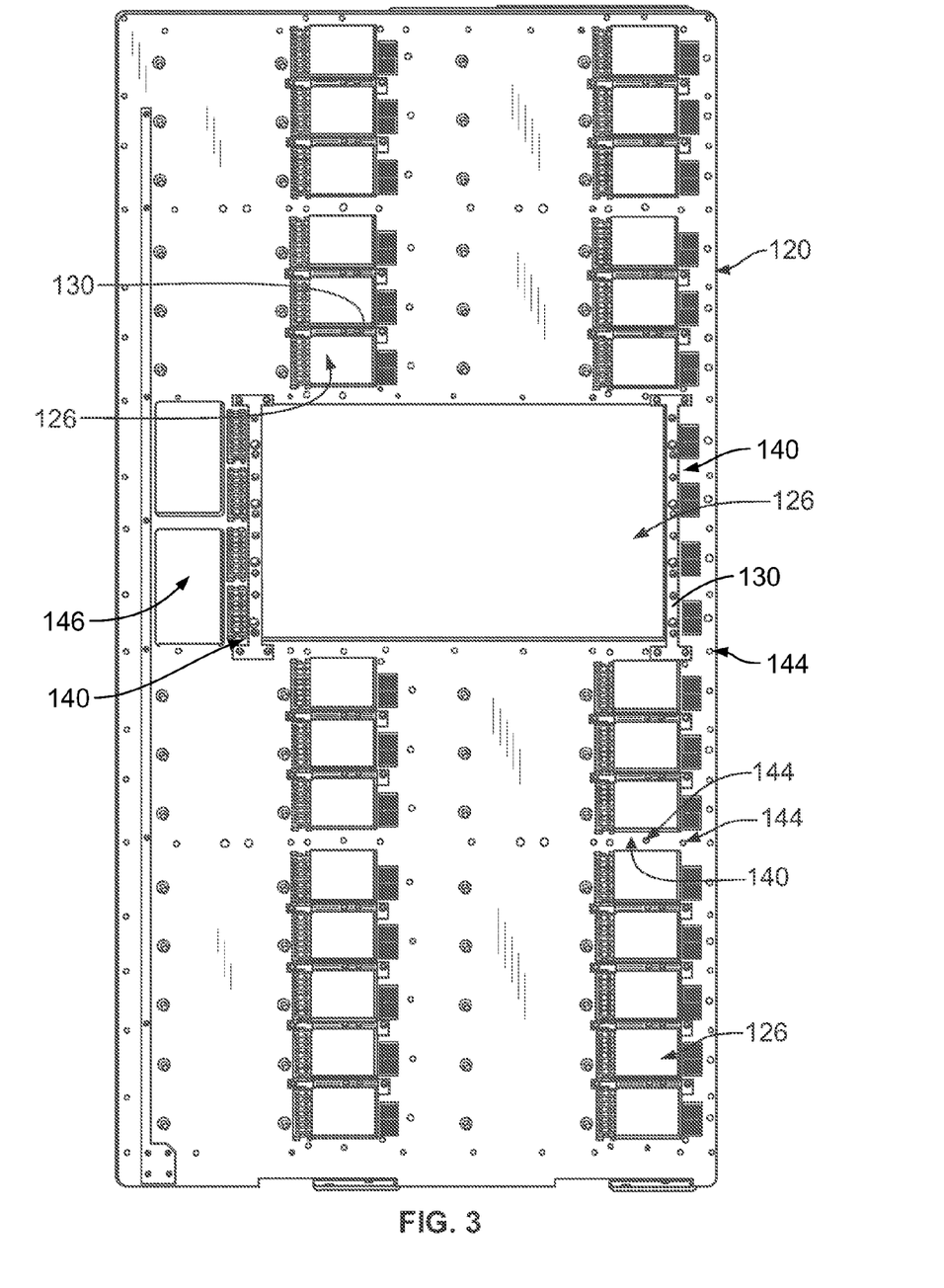
FIG. 3 illustrates a backplane of the cable backplane system and formed in accordance with an exemplary embodiment.

FIG. 3 illustrates the backplane 120 formed in accordance with an exemplary embodiment. The backplane 120 includes the connector openings 126 that receive the cable connectors 116 and/or portions of the trays 114 (both shown in FIG. 1). The connector openings 126 may be single openings that receive single cable connectors 116, such as the cable connectors 116 associated with the line cards 102 (shown in FIG. 1). The connector openings 126 may be large openings that receive multiple cable connectors 116, such as the cable connectors 116 associated with the switch cards 104 (shown in FIG. 1).

The backplane 120 includes board areas 140 surrounding the connector openings 126. The board areas 140 provide a mounting location for the stiffeners 130. Optionally, stiffeners 130 may be provided adjacent each connector opening 126. The stiffeners 130 are rigid and may stiffen the structure of the backplane 120. For example, because many holes or openings are provided in the structure of the backplane 120, such as to receive the cable connectors 116 (shown in FIG. 1) or other components, such as power components, airflow system components and the like, the stiffeners 130 add structural strength and rigidity to the backplane 120. The stiffeners 130 may be metal stiffeners separately fabricated from the backplane 120 and attached to the backplane 120.

The backplane 120 includes holes 144 therethrough that receive guide features, fasteners or other components used to assemble the cable backplane system 100. The holes 144 may define guide holes (which may be referred to hereinafter as guide holes 144) that receive guide features such as guide pins. The holes 144 may define threaded holes that receive threaded fasteners to secure the stiffeners 130, the cable rack 112 (shown in FIG. 2), or other components to the backplane 120. The backplane 120 may include component openings 146 therethrough that receive other electrical components, such as power supplies, airflow components, and the like, that are attached to the backplane 120. Some electrical components may be surface mounted to the backplane 120. Optionally, some electrical connectors may be terminated and fixed to the backplane 120, such as through-hole mounting to plated vias of the backplane 120 that are electrically connected to conductive traces on layers of the backplane 120. The electrical connectors may be mounted in the board areas 140 near the connector openings 126 that receive the cable connectors 116 (shown in FIG. 1).

Figure 4:
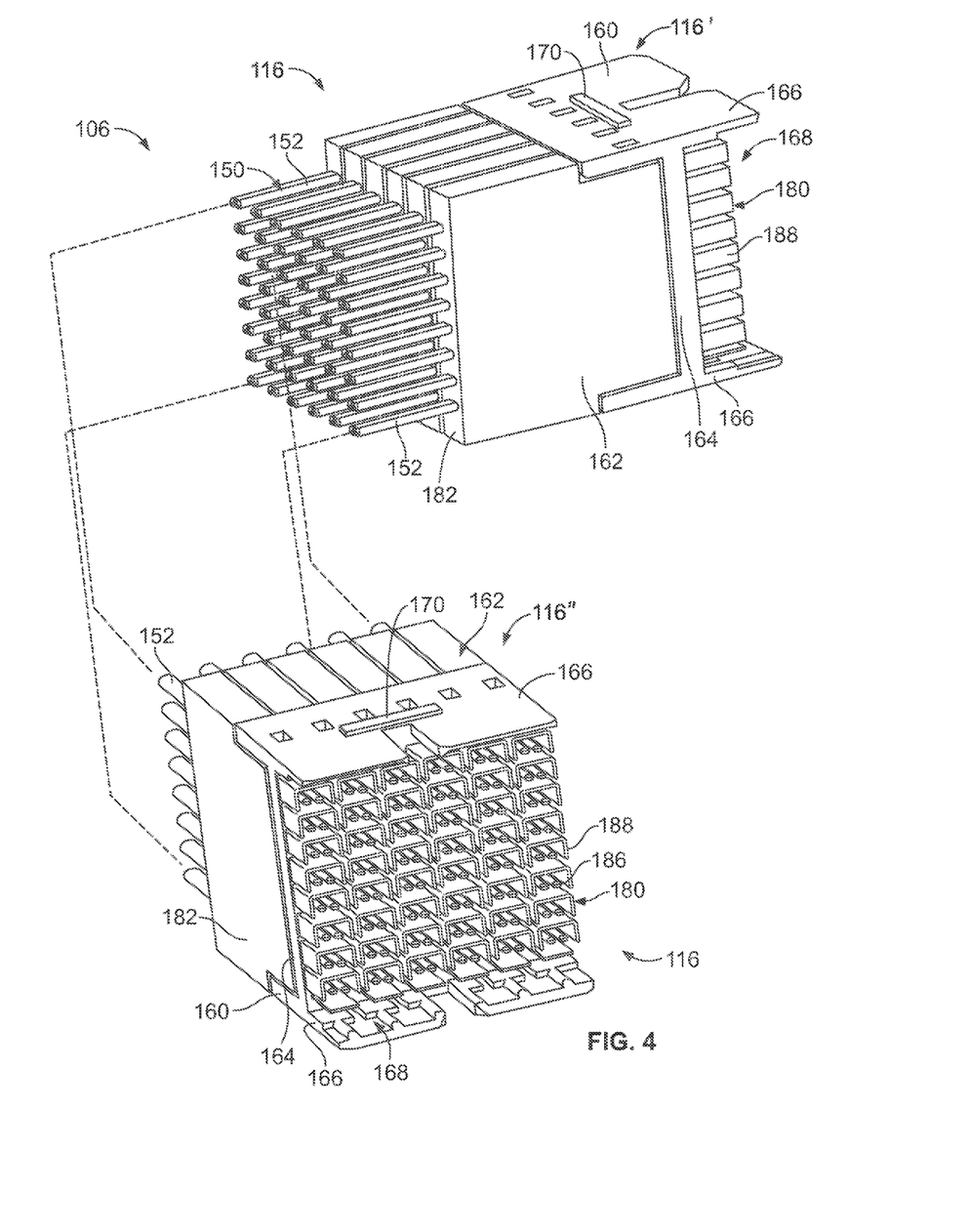
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the shroud walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metallized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in parallel columns. Any number of contact modules 162 may be held by the header housing 160 depending on the particular application. When the contact modules 162 are stacked in the header housing 160, the cable assemblies 180 may also be aligned in rows.

Figure 5:
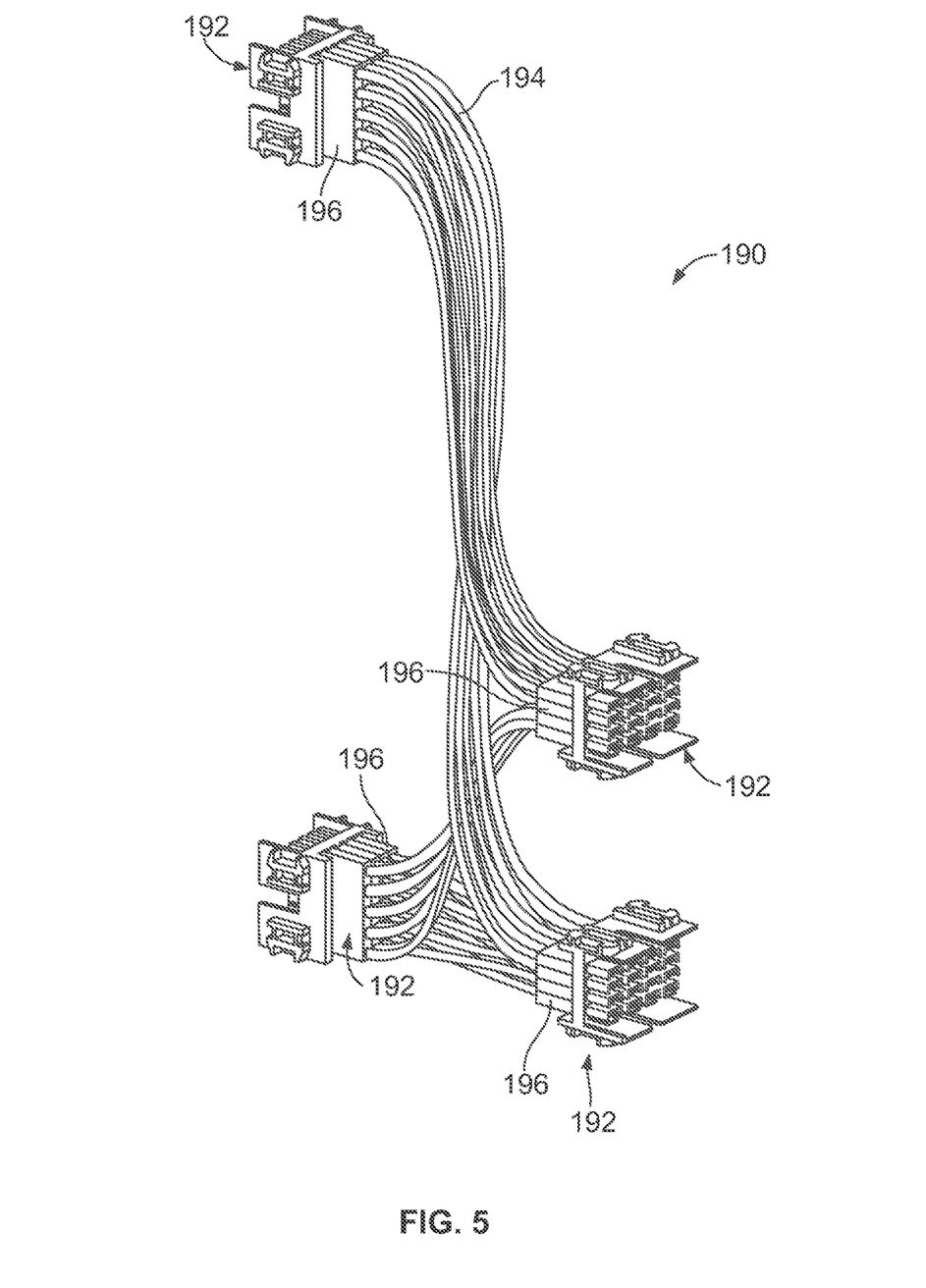
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
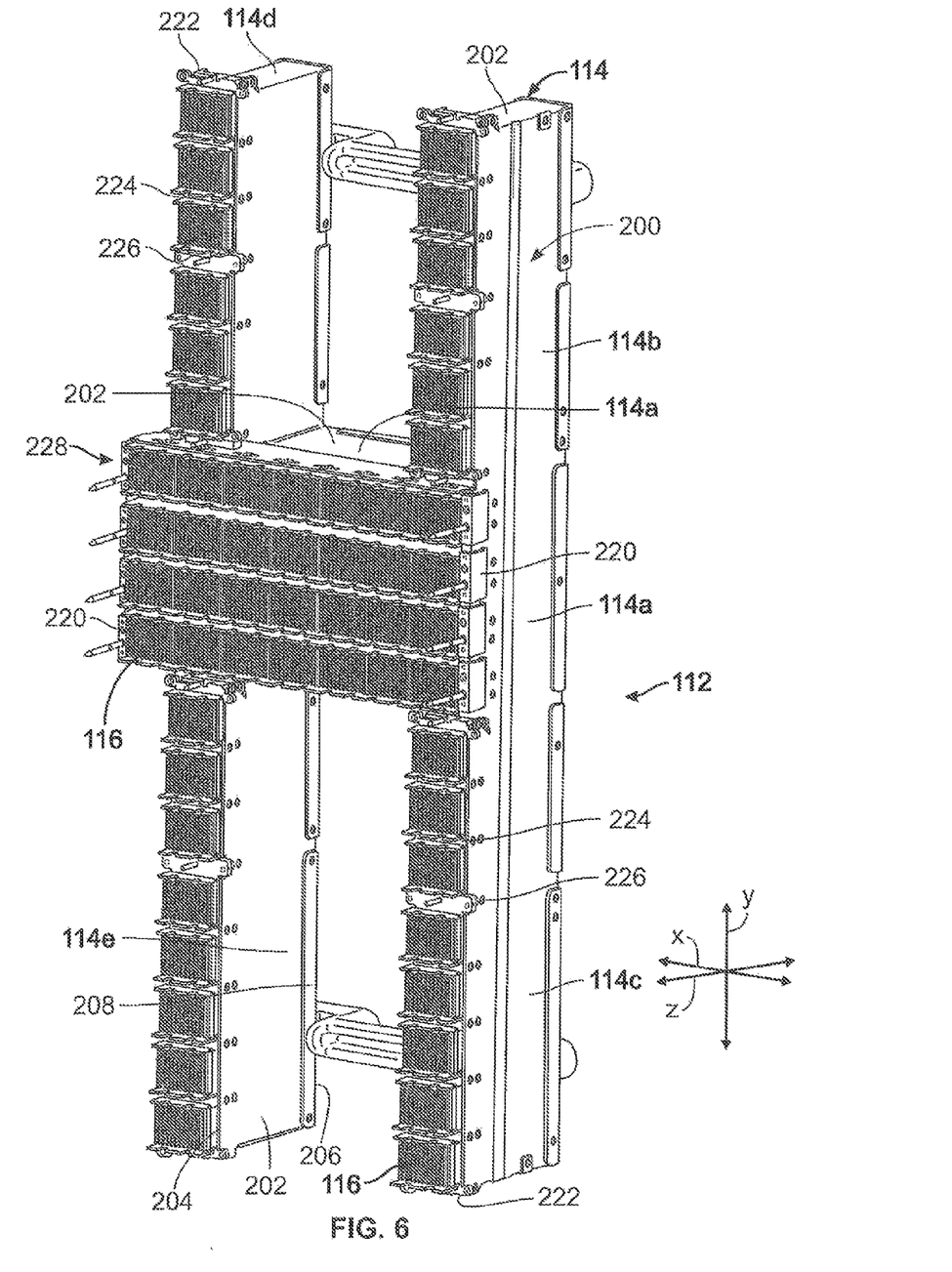
FIG. 6 illustrates a cable rack of the cable backplane system and formed in accordance with an exemplary embodiment.

FIG. 6 illustrates the cable rack 112. The cable rack 112 includes one or more trays 114 connected together to form the cable rack 112. In the illustrated embodiment, the cable rack 112 includes five trays 114a, 114b, 114c, 114d and 114e;

however any number of trays 114 may be used in alternative embodiments. The trays 114 are coupled together into an H-shaped configuration having the first tray 114a at a central location with the other trays 114b, 114c, 114d, 114e extending outward from the first tray 114a as legs. The cable rack 112 may have other shapes in alternative embodiments.

In an exemplary embodiment, the first tray 114a is used to hold the cable connectors 116 that are mated with the card connectors 134 of the switch cards 104 (both shown in FIG. 1). The cable connectors 116 in the first tray 114a may be held together as one or more bricks 228. The cable connectors 116 of each brick 228 are connected to the card connectors 134 of the same switch card 104. The other trays 114b, 114c, 114d, 114e are used to hold the cable connectors 116 that are mated with the card connectors 132 of the line cards 102 (both shown in FIG. 1). Optionally, the cable connectors 116 aligned at the same vertical position but in different trays (e.g. 114b and 114d or 114c and 114e) are connected to the card connectors 132 of the same line card 102.

Each tray 114 includes a frame 200 surrounding a raceway through which the cables 152 (shown in FIG. 4) are routed. The raceways are open to one another to allow the cables 152 to be routed from one tray 114 into another tray 114. The frame 200 includes side walls 202 extending between a front edge 204 and a rear 206 of the tray 114. A back wall 208 covers the raceway at the rear 206. The frame 200 is open at the front edge 204 between the side walls 202 to receive the cable connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable connectors 116 in the connector openings 126 (shown in FIG. 3) in the backplane 120. Optionally, the trays 114 may be connected to each other with some freedom of movement or float in the connection to allow the trays 114 to move relative to one another to properly align the cable connectors 116 with the connector openings 126 in the backplane 120.

The cable rack 112 includes a plurality of spacers 220, 222, 224, 226 used to hold positions of the cable connectors 116. The spacers 220, 222, 224, 226 may be different types of spacers. The spacers 220, 222, 224, 226 may have different sizes, shapes and/or features, such as guide pins. The spacers 220, 222, 224, 226 generally have similar functions, such as supporting one or more cable connectors 116.

In the illustrated embodiment, the spacers 220 are provided along sides of corresponding bricks 228 of cable connectors 116 that are located in the tray 114a. The bricks 228 are a group of cable connectors 116 that are held together in a stacked arrangement for mating with a plurality of the card connectors 134 of the same switch card 104 (both shown in FIG. 1). Spacers are not provided between each of the cable connectors 116 of the brick 228, but rather the spacers 220 only flank the end-most cable connectors 116 of the brick 228. The spacers 220 may be referred to hereinafter as side spacers 220 or brick spacers 220.

The spacers 222 are provided at ends of the trays 114b, 114c, 114d, 114e, such as to support the end-most cable connectors 116 in such trays 114. The spacers 222 may be referred to hereinafter as end spacers 222. The end spacers 222 are provided at the top and bottom ends of the cable rack 112. The end spacers 222 support a single cable connector 116.

The spacers 224 are provided between adjacent cable connectors 116. The spacers 224 may be referred to hereinafter as intermediate spacers 224. The spacers 224 each support two cable connectors 116. The spacers 226 are provided between adjacent cable connectors 116, similar to the intermediate spacers 224; however the spacers 226 have guide pins extending therefrom, which may be used for guiding the cable rack 112 into alignment and engagement with the backplane 120. The spacers 226 may be referred to hereinafter as guide spacers 226.

In an exemplary embodiment, the cable connectors 116 are movable relative to the spacers 220, 222, 224, 226 to allow the cable connectors 116 to align with the corresponding connector openings 126 during assembly of the cable rack 112 and backplane 120. For example, the spacers 220, 222, 224, 226 may allow X, Y and/or Z float to allow fine alignment of the cable connectors 116 with the connector openings 126. Once the cable connectors 116 are positioned in the connector openings 126, the spacers 220, 222, 224, 226 may be fixed to the stiffeners 130 (shown in FIG. 3), such as using fasteners to securely couple the cable rack 112 to the backplane 120 with the cable connectors 116 generally in position for mating with the corresponding card connectors 132, 134. In an exemplary embodiment, the cable connectors 116 are configured to float within the connector openings 126 relative to the spacers 220, 222, 224, 226 to obtain a true position for aligning to and mating with the corresponding card connectors 132, 134.

Figure 7:
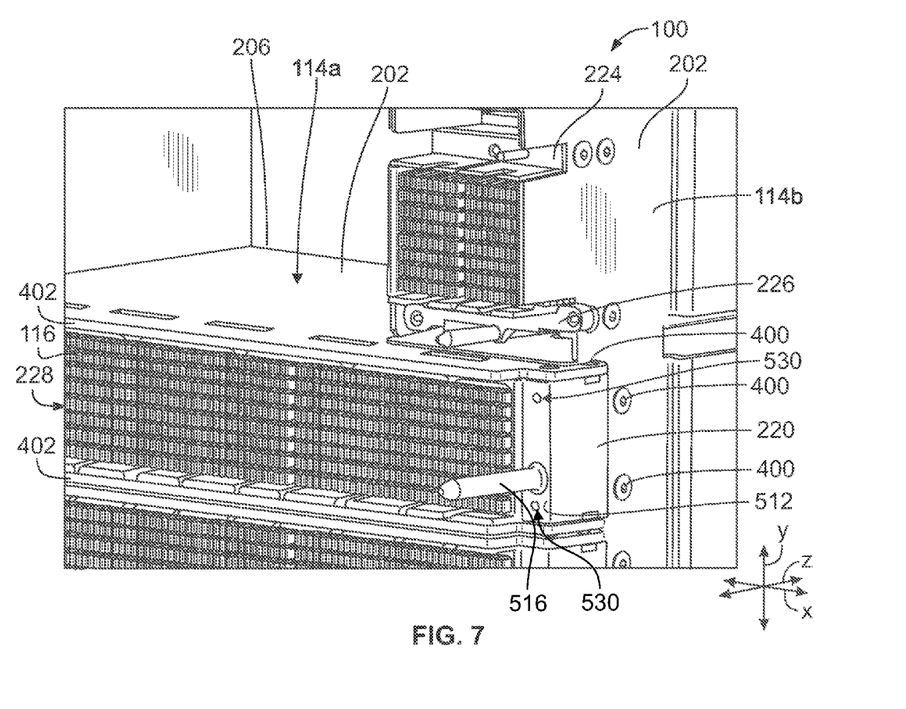
FIG. 7 is a front view of a portion of the cable backplane system.

FIG. 7 is a front view of a portion of the cable backplane system 100. FIG. 7 illustrates the trays 114a, 114b showing the spacers 220, 224, 226 used for mounting the trays 114 to the backplane 120 (shown in FIG. 1). FIG. 7 illustrates the side spacers 220 coupled to the bricks 228, forming part of the first tray 114a. Each brick 228 includes side walls 402, which may be top and bottom plates extending along tops and bottoms of the cable connectors 116. The side walls 402 hold the cable connectors 116 of the brick 228. The side walls 402 of the outermost bricks 228 (for example, the upper and lower side walls 402) may define the side walls 202 of the tray 114a. The side spacers 220 are positioned between the side walls 402. The side walls 402 of the bricks 228 may or may not extend to the rear 206.

The side spacers 220 are configured to be coupled to corresponding stiffeners 130 (shown in FIG. 3) on the backplane 120 (shown in FIG. 1). The stiffeners 130 secure the side spacers 220 in place relative to the backplane 120. The side spacers 220 are coupled to the side walls 402, and thus the first tray 114a, using float mechanisms 400. The float mechanisms 400 allow movement in mutually perpendicular X, Y and/or Z directions. The side walls 402 are movable relative to the side spacers 220, and thus the stiffeners 130 and backplane 120, using the float mechanisms 400 to properly position the cable connectors 116 relative to the backplane 120.

In an exemplary embodiment, the first tray 114a is secured to the second tray 114b using float mechanisms 400. The first and second trays 114a, 114b are movable relative to one another using the float mechanisms 400. The float mechanisms 400 allow movement in the X, Y and Z directions. The other trays 114 may be connected together in a similar manner using similar types of float mechanisms 400.

In an exemplary embodiment, the float mechanism 400 is a fastener such as a countersink screw. The float mechanisms 400 may be fasteners that are received in oversized holes or apertures in the trays 114 that allow the float mechanisms 400 to move in one or more directions relative to the trays 114. A circumferential gap may be defined around the float mechanism 400 in the aperture in the side wall 202 allowing the float mechanism 400 to move within the aperture. The size of the gap defines the amount of float. Optionally, the gap may allow approximately 1.0 mm of float in the X, Y and Z directions; however the gap may allow more or less float in alternative embodiments. Other types of float mechanisms may be used in alternative embodiments that tie the trays 114 together but allow limited relative movement therebetween.

The side spacer 220 includes a front 512 facing forward. The side spacer 220 includes a guide pin 516 extending from the front 512. The guide pin 516 may be used to align the side spacer 220 with the backplane 120 and/or the stiffener 130 (shown in FIG. 3). For example, the guide pin 516 may pass through one of the holes 144 (shown in FIG. 3) in the backplane 120 and into the stiffener 130. In an exemplary embodiment, the side spacer 220 includes bores 530 in the front 512. The bores 530 may be threaded. A fastener may be used to secure the side spacer 220 to the stiffener 130.

Figure 8:
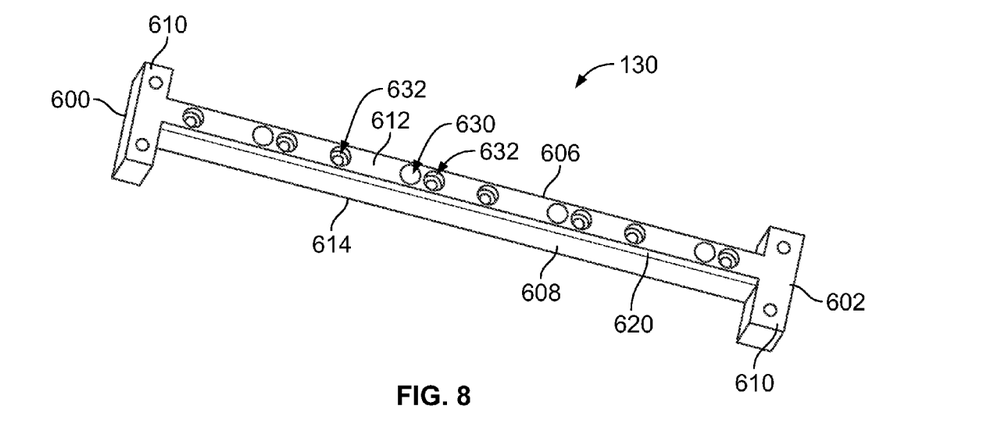
FIG. 8 is a front perspective view of a stiffener of the cable backplane system.
Figure 9:
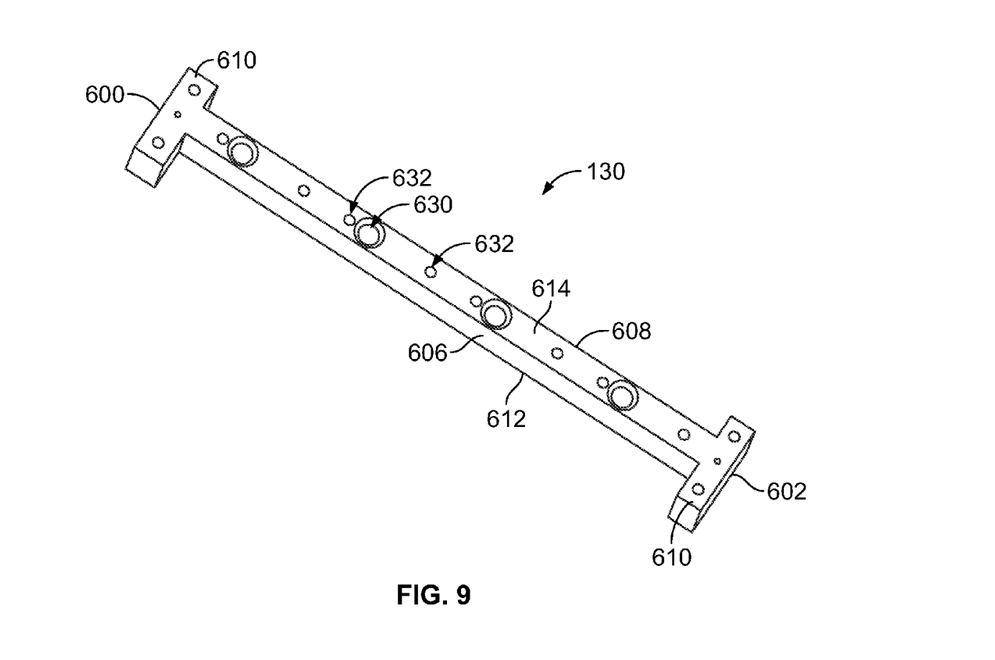
FIG. 9 is a rear perspective view of a stiffener for the cable backplane system and formed in accordance with an exemplary embodiment.

FIG. 8 is a front perspective view of one of the stiffeners 130 formed in accordance with an exemplary embodiment. FIG. 9 is a rear perspective view of the stiffener 130. The stiffener 130 extends longitudinally between first and second ends 600, 602. The stiffener 130 includes first and second side walls 606, 608 extending longitudinally between the first and second ends 600, 602. The first and second side walls 606, 608 face in opposite directions. Optionally, the stiffener 130 may include flanges 610 extending from the first and/or second side walls 606, 608 at the first and/or second ends 600, 602. The flanges 610 may provide additional stability for the stiffener 130 on the backplane 120, such as to reduce rocking on the backplane 120.

The stiffener 130 includes a front 612 and a rear 614 opposite the front 612. The rear 614 may be mounted to the backplane 120. Optionally, the rear 614 may abut against and rest on the front 128 (shown in FIG. 1) of the backplane 120. In an exemplary embodiment, the stiffener 130 includes lead-in surfaces 620 at the front 612 that transition to the side walls 606, 608. The lead-in surfaces 620 are chamfered and may be angled at approximately 45°. The lead-in surfaces 620 may extend along only a portion or portions of the stiffener 130, such as in the area where the card connectors 132 and/or 134 (shown in FIG. 1) are mated with the cable connectors 116. The lead-in surfaces 620 may provide lead-in or guidance for the card connectors 132 and/or 134 during mating with the cable connectors 116.

In an exemplary embodiment, the stiffener 130 includes one or more guide bores 630 extending at least partially through the stiffener 130. The guide bores 630 receive corresponding guide pins 516 (shown in FIG. 7) from the side spacer 220. The guide bores 630 may receive guide pins from other components, such as other types of spacers, the backplane 120, the cable connectors 116, the cards 102, 104, and the like. Optionally, the guide bores 630 may have lead-ins at the rear 614 to guide the guide pins 516 into the guide bores 630.

In an exemplary embodiment, the stiffener 130 includes one or more fastener bores 632 that receive fasteners, such as threaded fasteners. Optionally, the fastener bores 632 may be countersunk at the front 612 such that the fasteners are sunk flush or below the front 612. The fastener bores 632 may receive fasteners that are used to threadably couple the stiffener 130 to the backplane 120. The fastener bores 632 may receive fasteners that are used to threadably couple the stiffener 130 to the side spacers 220. In the illustrated embodiment, the stiffener 130 includes multiple sets of fastener bores 632 that receive fasteners to fasten multiple side spacers 220 to the stiffener 130. The fastener bores 632 may receive fasteners that couple the stiffener 130 to the chassis 110 (shown in FIG. 1). The fastener bores 632 may receive fasteners that are used to threadably couple the stiffener 130 to the card connectors 132, 134 or to other components.

Figure 10:
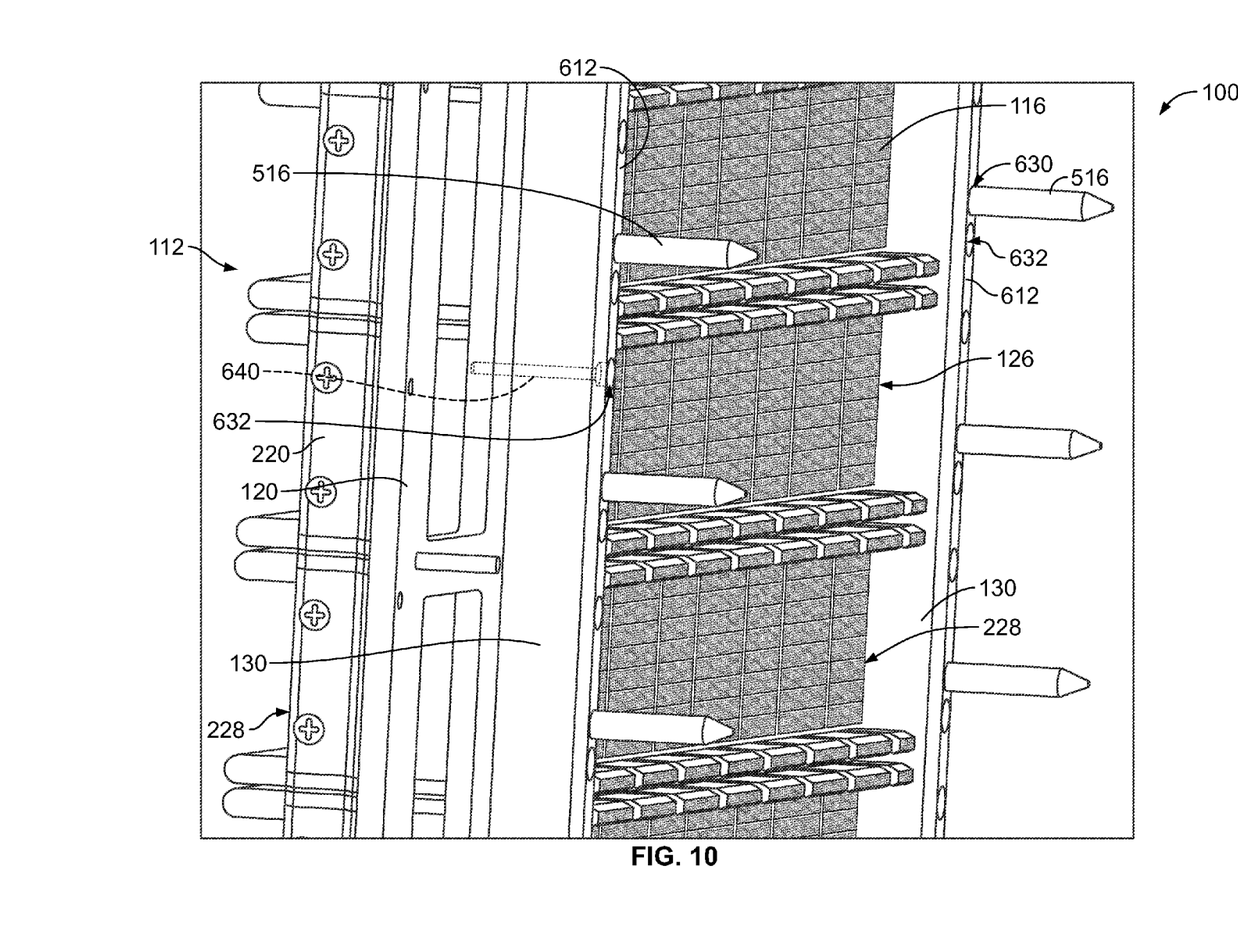
FIG. 10 is a front perspective view of the stiffener for the cable backplane system.

FIG. 10 is a front perspective view of a portion of the cable backplane system 100 showing two stiffeners 130 flanking opposite sides of a corresponding connector opening 126 in the backplane 120. The stiffeners 130 are secured to the backplane 120 using fasteners 640 (one shown in phantom in FIG. 10) received in the fastener bores 632. In an exemplary embodiment, the stiffeners 130 are mounted to the backplane 120 prior to the cable rack 112 being coupled to the backplane 120. The stiffeners 130 may be used to strengthen the backplane 120 during mounting of the cable rack 112 thereto. The stiffeners 130 may be used to hold and/or locate the cable rack 112 during mounting to the backplane 120.

In an exemplary embodiment, multiple bricks 228 are received in the connector opening 126. Optionally, the stiffeners 130 may extend forward of the cable connectors 116 to help guide mating of the card connectors 134 of the switch card 104 (both shown in FIG. 1) into the cable backplane system 100. Each brick 228 includes two side spacers 220 on opposite sides thereof. Each of the side spacers 220 includes the guide pins 516, which extend through the backplane 120 into the corresponding guide bores 630 in the stiffeners 130 to locate the side spacers 220 relative to the stiffeners 130. In an exemplary embodiment, the guide pins 516 extend entirely through the side spacers 220 beyond the front 612 thereof. The guide pins 516 are configured to interact with guide modules of the switch card 104 to locate the switch card 104 during mating with the cable connectors 116.

Figure 11:
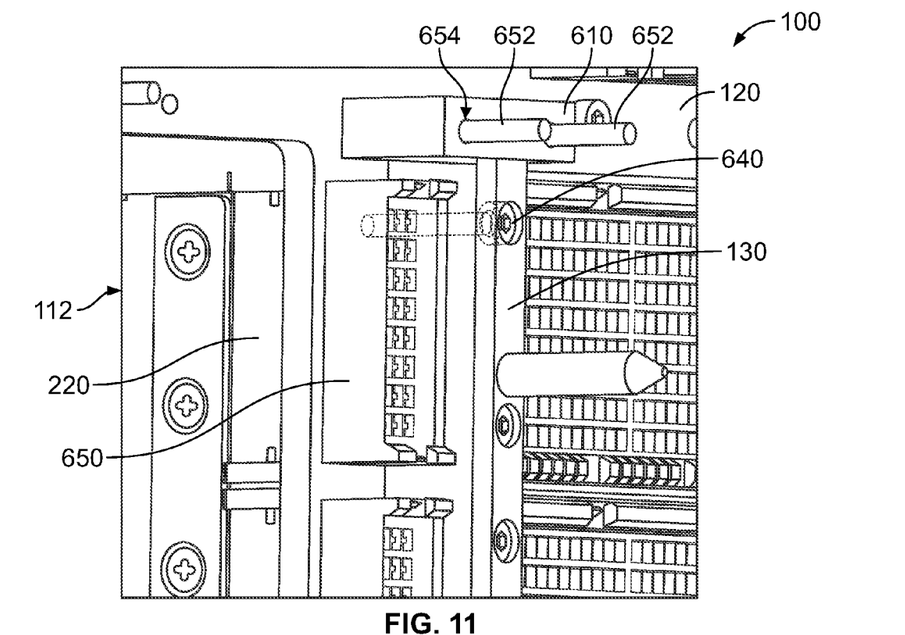
FIG. 11 is a front perspective view of a portion of the cable backplane system.
Figure 12:
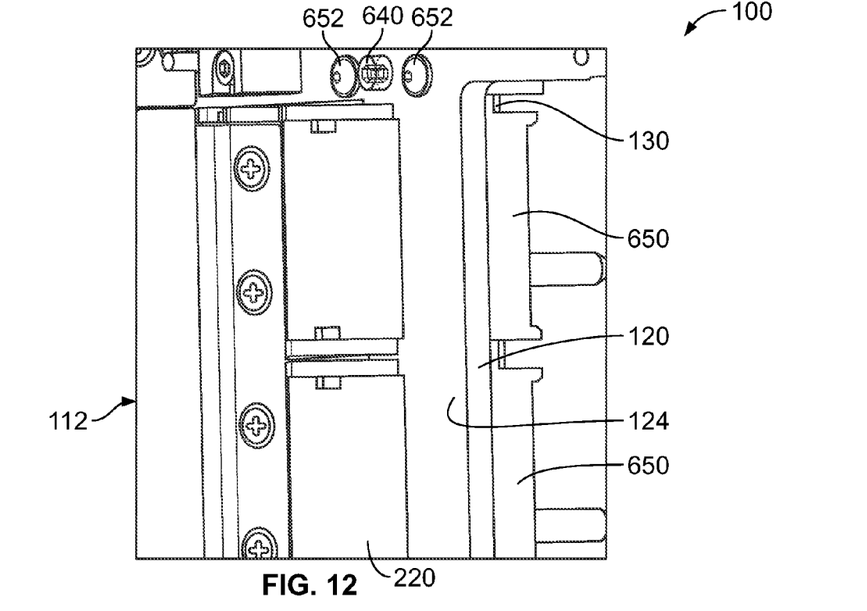
FIG. 12 is a rear perspective view of a portion of the cable backplane system.

FIG. 11 is a front perspective view of a portion of the cable backplane system 100. FIG. 12 is a rear perspective view of a portion of the cable backplane system 100. Fixed connectors 650 are illustrated in FIGS. 11 and 12 mounted to the backplane 120 along the stiffener 130. The fixed connectors 650 are electrically connected to traces routed through the backplane 120. The fixed connectors 650 are configured to be electrically connected to corresponding card connectors 134 on the switch card 104 (both shown in FIG. 1).

One of the fasteners 640 is illustrated in phantom in FIG. 11 extending through the stiffener 130. The fastener 640 is threadably coupled to the corresponding side spacers 220 to securely couple the side spacer 220 to the stiffener 130 and the backplane 120. The backplane 120 is sandwiched between the side spacer 220 and the stiffener 130. Optionally, each side spacer 220 is coupled to the stiffener 130 using two fasteners 640.

A plurality of chassis fasteners 652 are illustrated in FIGS. 11 and 12. The chassis fasteners 652 are used to securely couple the stiffener 130 and backplane 120 to the chassis 110 (shown in FIG. 1). In the illustrated embodiment, the chassis fasteners 652 are loaded through the backplane 120 from the rear 124. The chassis fasteners 652 are loaded through chassis fastener bores 654 in the stiffener 130 and protrude forward of the stiffener 130. The chassis fastener bores 654 are located in the flange 610. Having the stiffener 130 secured to the chassis 110 may reduce pressure on the backplane 120. Having the stiffener 130 secured to the chassis 110 may make the cable backplane system 100 more rigid and easier to mate the line and switch cards 102, 104 (shown in FIG. 1) to the cable backplane system 100. For example, the chassis 110 may be used to guide mating of the line and switch cards 102, 104 if the backplane 120, and thus the cable rack 112, is precisely located relative to the chassis 110.

Figure 13:
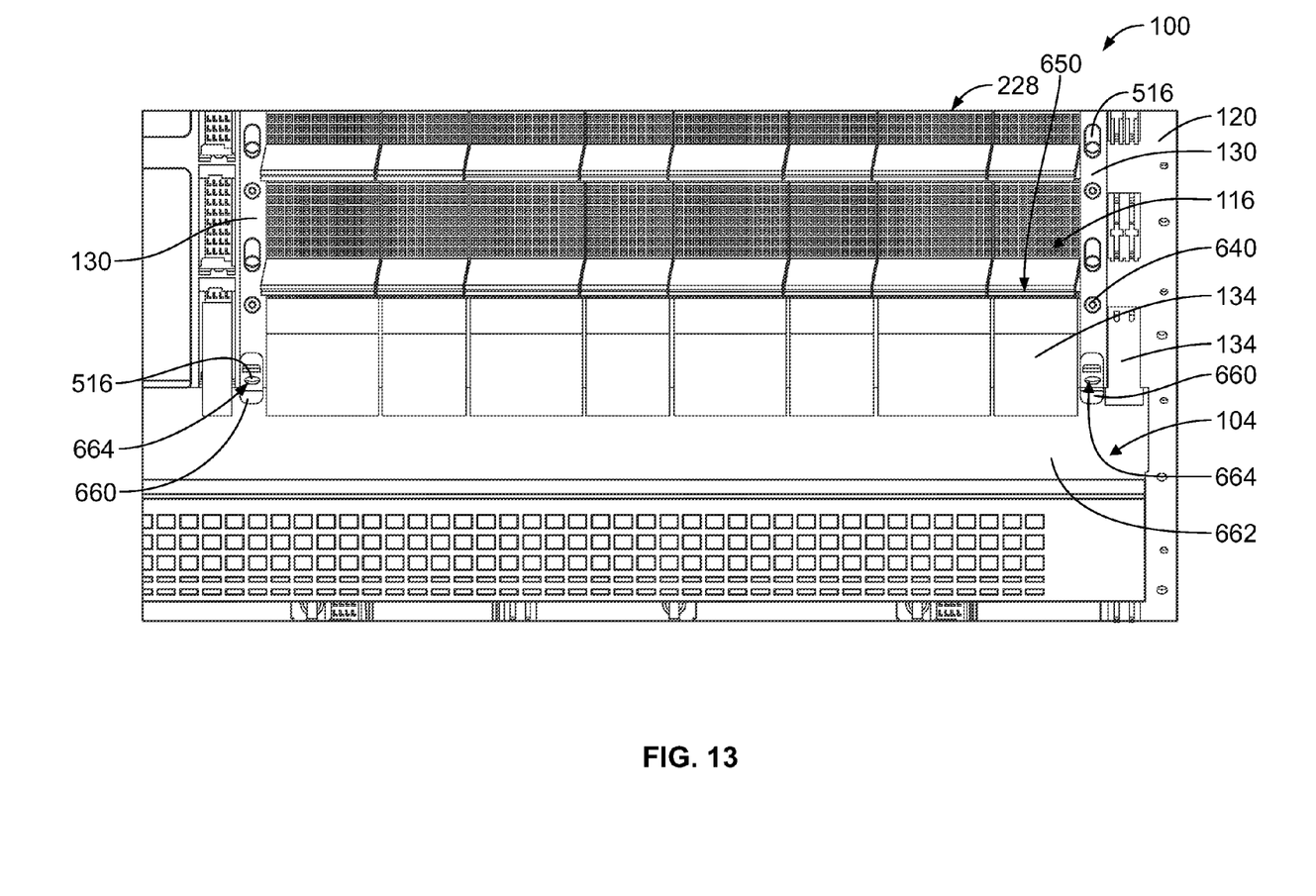
FIG. 13 is a front view of a portion of the cable backplane system showing a switch card coupled to corresponding cable connectors.

FIG. 13 is a front view of a portion of the cable backplane system 100 showing a switch card 104 coupled to corresponding cable connectors 116. The switch card 104 includes guide modules 660 mounted to the circuit board 662 of the switch card 104. The guide modules 660 include guide openings 664 that receive the guide pins 516 extending forward of the stiffeners 130. The guide pins 516 are part of the side spacers 220 (shown in FIG. 9) and thus part of the corresponding brick 228, which allows the switch card 104 to be precisely located relative to the brick 228 and corresponding cable connectors 116. FIG. 13 illustrates card connectors 134 mated with corresponding fixed connectors 650.

Embodiments described herein provide stiffeners 130 that stiffen the backplane 120 and provide rigid mounting points for the bricks 228. For example, the side spacers 220 that support the cable assemblies 116 of the brick 228 may be located using the guide pins 516 and fixedly coupled to the stiffeners 130 using fasteners 640. Coupling the bricks 228 to the stiffeners 130 eliminates overstress on the backplane 120. Having multiple bricks 228 coupled to the same stiffener 130 eliminates the need to couple many stiffeners to the backplane 120 and provides better positioning of the bricks 228. The stiffeners 130 provide guidance for mating of the card connectors 132 and/or 134 with the cable connectors 116.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
a backplane having board areas surrounding a connector opening extending between a front and a rear of the backplane, the backplane having holes in the board areas along the connector opening;
stiffeners coupled to corresponding board areas along the front of the backplane, the stiffeners extending along the connector opening, the stiffeners having bores aligned with corresponding holes in the backplane; and
a cable rack coupled to the rear of the backplane, the cable rack comprising a tray having a frame surrounding a raceway and spacers coupled to the tray, the spacers holding corresponding cable connectors, the spacers having guide pins extending therefrom, the guide pins passing through the holes in the backplane into corresponding bores in the stiffeners to position the spacers relative to the stiffeners and the backplane, wherein the cable connectors are received in the connector opening in the backplane and held in position relative to the backplane by the spacers and the stiffeners.

2. The cable backplane system of claim 1, wherein a plurality of the spacers are coupled to each stiffener.

3. The cable backplane system of claim 1, wherein the guide pins extend thorough the bores and beyond a front of the corresponding stiffener to mate with a daughtercard mated to the cable backplane system.

4. The cable backplane system of claim 1, wherein the stiffeners are fixed to the backplane and the spacers are fixed to the stiffeners to locate the cable connector assemblies within the connector opening.

5. The cable backplane system of claim 1, further comprising fasteners extending through corresponding fastener bores in the stiffener and fastener holes in the backplane to threadably couple to the spacer to secure the spacer to the stiffener.

6. The cable backplane system of claim 1, wherein the stiffener comprises an elongated body having flanges at opposite ends thereof, the flanges being secured to the backplane by fasteners.

7. The cable backplane system of claim 6, wherein the flanges are secured to a chassis by the fasteners.

8. The cable backplane system of claim 1, wherein the cable connectors are configured to be mated to corresponding card connectors of a daughtercard mated to the cable backplane system.

9. The cable backplane system of claim 8, wherein the cable connectors float relative to the spacers within the connector opening for mating with the corresponding card connectors.

10. The cable backplane system of claim 8, wherein the cable rack further comprises side walls extending between corresponding spacers, a plurality of cable connectors extending between corresponding side walls, the cable connectors float relative to the side walls within the connectors opening.

11. The cable backplane system of claim 1, wherein each stiffener comprises an elongated body having a front and a rear, the rear being mounted to the front of the backplane, the bores being open at the rear, the bores each having a lead-in at the rear to direct the guide pins into the bore.

12. A cable backplane system comprising:
a backplane having board areas surrounding a connector opening extending between a front and a rear of the backplane, the backplane having holes in the board areas along the connector opening;
stiffeners coupled to corresponding board areas along the front of the backplane, the stiffeners extending along the connector opening, the stiffeners having bores extending therethrough, the bores being aligned with corresponding holes in the backplane; and
a cable rack coupled to the rear of the backplane, the cable rack comprising a tray having a frame surrounding a raceway and spacers coupled to the tray, the spacers holding corresponding cable connectors configured to be mated with corresponding card connectors of a daughtercard, the spacers having guide pins extending therefrom, the guide pins passing through corresponding holes in the backplane and passing through corresponding bores in the stiffeners to position the spacers relative to the stiffeners and the backplane, the guide pins extending beyond the stiffeners to engage guide modules of the daughtercard to locate the daughtercard relative to the stiffener and backplane.

13. The cable backplane system of claim 12, wherein a plurality of the spacers are coupled to each stiffener.

14. The cable backplane system of claim 12, wherein the stiffeners are fixed to the backplane and the spacers are fixed to the stiffeners to locate the cable connectors within the connector opening.

15. The cable backplane system of claim 12, further comprising fasteners extending through corresponding fastener bores in the stiffener and fastener holes in the backplane to threadably couple to the spacer to secure the spacer to the stiffener.

16. The cable backplane system of claim 12, wherein each stiffener comprises an elongated body having a front and a rear, the rear being mounted to the front of the backplane, the bores being open at the rear, the bores each having a lead-in at the rear to direct the guide pins into the bore.

17. A cable backplane system comprising:
  a chassis having frame members;
  a backplane having board areas surrounding a connector opening extending between a front and a rear of the backplane;
  stiffeners coupled to corresponding board areas along the front of the backplane, the stiffeners extending along the connector opening, the stiffeners being secured to corresponding frame members of the chassis; and
  a cable rack coupled to the rear of the backplane, the cable rack comprising:
    a tray having a frame surrounding a raceway;
    spacers coupled to the tray, the spacers being secured to corresponding stiffeners using fasteners passing through the backplane to position the spacers relative to the backplane; and
    cable connector assemblies held by corresponding spacers, each cable connector assembly having a cable connector and a plurality of cables extending from the cable connector, the cables being routed in the raceway, the cable connectors being received in the connector opening and held in position relative to the backplane by the spacers.

18. The cable backplane system of claim 17, wherein a plurality of the spacers are coupled to each stiffener.

19. The cable backplane system of claim 17, wherein the stiffeners are fixed to the backplane and the spacers are fixed to the stiffeners to locate the cable connectors within the connector opening.

20. The cable backplane system of claim 17, wherein each stiffener comprises an elongated body having a front and a rear, the rear being mounted to the front of the backplane, the front of the stiffener abutting against the chassis, fasteners passing through the backplane and stiffener into the chassis, the fasteners being threadably coupled to the chassis.

* * * * *